(12) United States Patent
Muraki et al.

(10) Patent No.: US 7,947,995 B2
(45) Date of Patent: May 24, 2011

(54) GALLIUM NITRIDE-BASED COMPOUND SEMICONDUCTOR LIGHT EMITTING DEVICE

(75) Inventors: Noritaka Muraki, Ichihara (JP); Naoki Fukunaga, Ichihara (JP)

(73) Assignee: Showa Denko K.K., Tokyo (JP)

( * ) Notice: Subject to any disclaimer, the term of this patent is extended or adjusted under 35 U.S.C. 154(b) by 38 days.

(21) Appl. No.: 12/065,172

(22) PCT Filed: Nov. 8, 2007

(86) PCT No.: PCT/JP2007/072142
§ 371 (c)(1),
(2), (4) Date: Feb. 28, 2008

(87) PCT Pub. No.: WO2008/059904
PCT Pub. Date: May 22, 2008

(65) Prior Publication Data
US 2010/0176418 A1      Jul. 15, 2010

(30) Foreign Application Priority Data
Nov. 13, 2006   (JP) ................................. 2006-306640

(51) Int. Cl.
*H01L 33/20* (2010.01)

(52) U.S. Cl. ........... 257/95; 257/E33.067; 257/E51.021; 257/98

(58) Field of Classification Search ...... 257/95
See application file for complete search history.

(56) References Cited

U.S. PATENT DOCUMENTS

| | | | |
|---|---|---|---|
| 5,793,062 A | 8/1998 | Kish, Jr. et al. | |
| 2002/0197439 A1* | 12/2002 | Berneth et al. | 428/64.4 |
| 2005/0104081 A1 | 5/2005 | Kim et al. | |
| 2006/0043386 A1 | 3/2006 | Furukawa et al. | |
| 2006/0078020 A1* | 4/2006 | Izu et al. | 372/43.01 |
| 2006/0145171 A1 | 7/2006 | Nitta et al. | |
| 2006/0192247 A1 | 8/2006 | Urashima et al. | |

FOREIGN PATENT DOCUMENTS

| | | |
|---|---|---|
| JP | 7-131066 | 5/1995 |
| JP | 9-107123 | 4/1997 |
| JP | 10-200156 | 7/1998 |
| JP | 2001-284650 A | 10/2001 |
| JP | 2003-338637 | 11/2003 |
| JP | 2005-150675 | 6/2005 |
| JP | 2005-276900 | 10/2005 |
| JP | 2006-66422 | 3/2006 |
| JP | 2006-253670 | 9/2006 |

* cited by examiner

*Primary Examiner* — Minh-Loan T Tran
*Assistant Examiner* — Fei Fei Yeung Lopez
(74) *Attorney, Agent, or Firm* — Sughrue Mion, PLLC

(57) ABSTRACT

An object of the present invention is to provide a gallium nitride-based compound semiconductor light emitting device having superior light extraction efficiency and light distribution uniformity.

The inventive gallium nitride-based compound semiconductor light emitting device comprises a substrate and a gallium nitride-based compound semiconductor layer stacked on the substrate, wherein on at least one lateral surface of the light emitting device, the bottom (substrate side) of the semiconductor layer is a reverse taper inclined 5 to 85 degrees relative to the substrate main surface and the top of the semiconductor layer is a forward taper inclined 95 to 175 degrees relative to the substrate main surface.

10 Claims, 3 Drawing Sheets

GALLIUM NITRIDE-BASED COMPOUND SEMICONDUCTOR LIGHT EMITTING DEVICE

The current application is a national stage entry of PCT/JP07/72142 filed on Nov. 8, 2007.

TECHNICAL FIELD

The present invention relates to a gallium nitride-based compound semiconductor light emitting device, and more particularly, to a gallium nitride-based compound semiconductor light emitting device having superior emission output and light distribution uniformity.

BACKGROUND ART

Attention has recently been focused on GaN-based compound semiconductor light emitting devices as semiconductor materials for short wavelength light emitting devices. GaN-based compound semiconductors are formed by metal organic chemical vapor deposition (MOCVD) or molecular beam epitaxy (MBE) and the like on a substrate consisting of sapphire single crystal, various oxides or a group III-V compound.

The external quantum efficiency of a light emitting device is expressed as the product of light extraction efficiency and internal quantum efficiency. Internal quantum efficiency refers to the proportion of electrical current energy injected into a light emitting device that is converted to light. On the other hand, light extraction efficiency refers to the proportion of the total amount of light generated within a semiconductor crystal that can be extracted to the outside.

The internal quantum efficiency of light emitting devices has recently been improved to about 70 to 80% by improving the quality of gallium nitride-based compound semiconductor crystals and by examining the structure of the emission layer, and adequate effects have been obtained relative to the amount of injected current.

However, in not only the case of GaN-based compound semiconductors, but also in the case of light emitting diodes (LED), the light extraction efficiency relative to generated light is generally low, and it is difficult to say that internally emitted light generated by injected current is adequately extracted to the outside.

The cause of low light extraction efficiency is that light emitted in an emission layer is repeatedly reflected and absorbed by the crystal material within the LED structure, and when that light is radiated outside the semiconductor layer, emitted light is not extracted to the outside due to reflection beyond the critical angle according to Snell's law, thereby resulting in the light being re-reflected within the crystal and lowering the probability of light reaching the outside.

A technology has been proposed for improving this light extraction efficiency in which the light extraction surface is modified and the angle of the light extraction surface is changed in various ways to improve the light extraction efficiency (see, for example, Japanese Unexamined Patent Publication No. 2003-110136 and Japanese Unexamined Patent Publication No. 2004-6662).

In addition, the inventors of the present invention studied the use of an inverted tapered shape for the semiconductor layer on the lateral surface of a light emitting device that has an angle of less than 90 degrees relative to the substrate main surface for the purpose of enabling light to be efficiently extracted from the upper surface of a light emitting device.

However, when a gallium nitride-based compound semiconductor light emitting device having this inverted tapered lateral surface was mounted on a typical light emitting package, and the relationship between the emission angle and output characteristics was investigated, although a satisfactory emission output was obtained in the direction of the front surface due to light reflected by the inverted tapered lateral surface, adequate emission output was unable to be obtained where the emission angle is low, namely in the direction of the lateral surface of the light emitting diode, thereby demonstrating that light distribution uniformity is not satisfactory.

There has recently been a growing demand among LED light emitting packages for light emitting packages having a lower height than conventionally used light emitting devices for the purpose of reducing space and improving efficiency. In particular, modifications have been made to the package portion for mounting light emitting devices in which the interval between the package lateral surface and the light emitting device has been reduced in order to improve overall package efficiency by utilizing reflection of light. In such cases, technology for controlling and utilizing the light extraction angle from the device is important. A light emitting device having an inverted tapered lateral surface as described above has been experimentally determined to not allow the obtaining of adequate device characteristics in these special light emitting packages utilizing light from the lateral surface of semiconductor light emitting device.

DISCLOSURE OF THE INVENTION

An object of the present invention is to solve the aforementioned problems of the prior art by providing a gallium nitride-based compound semiconductor light emitting device having superior light extraction efficiency and light distribution uniformity.

The present invention provides the inventions indicated below.

(1) A gallium nitride-based compound semiconductor light emitting device comprising a substrate and a gallium nitride-based compound semiconductor layer stacked on the substrate, wherein on at least one lateral surface of the light emitting device, the bottom (substrate side) of the semiconductor layer is a reverse taper inclined 5 to 85 degrees relative to the substrate main surface and the top of the semiconductor layer is a forward taper inclined 95 to 175 degrees relative to the substrate main surface.

(2) The gallium nitride-based compound semiconductor light emitting device according to (1) above, wherein the thickness of the forward tapered portion is 0.1 to 3 µm.

(3) The gallium nitride-based compound semiconductor light emitting device according to (1) or (2) above, wherein the thickness of the reverse taper portion is 0.1 to 10 µm.

(4) The gallium nitride-based compound semiconductor light emitting device according to any one of (1) to (3) above, wherein the forward taper and the reverse taper are respectively formed by chemical etching having orthophosphoric acid as a main component thereof.

(5) The gallium nitride-based compound semiconductor light emitting device according to any one of (1) to (4) above, wherein the substrate is a C-plane sapphire substrate.

(6) The gallium nitride-based compound semiconductor light emitting device according to (5) above, wherein a lateral surface having the forward taper and the reverse taper is the A-plane side as viewed from the direction of the C-plane on the sapphire substrate.

(7) The gallium nitride-based compound semiconductor light emitting device according to (5) or (6) above, wherein the lateral surface that is an M-plane side when viewed from the direction of the C-plane on the sapphire substrate is a perpendicular surface not formed by the forward taper and the reverse taper.

(8) The gallium nitride-based compound semiconductor light emitting device according to any one of (5) to (7) above, wherein the external shape of the light emitting device is a quadrangle, each of the opposing lateral surfaces has a forward taper and a reverse taper, and each of the other opposing lateral surfaces is a perpendicular surface.

(9) A lamp comprising the gallium nitride-based compound semiconductor light emitting device according to any one of (1) to (8) above.

(10) An electronic device incorporated with the lamp according to (9) above.

(11) A mechanical apparatus incorporated with the electronic device according to (10) above.

As a result of the bottom (substrate side) of the lateral surface being a reverse taper inclined at 5 to 85 degrees relative to the substrate main surface, and the top being a forward taper inclined at 95 to 175 degrees relative to the substrate main surface, the gallium nitride-based compound semiconductor light emitting device of the present invention has high emission output and superior light distribution uniformity. In particular, adequate emission output can be attained even if mounted in a special light emitting package having a reduced interval between the package lateral surface and light emitting device.

BEST MODE FOR CARRYING OUT THE INVENTION

Figure 1:
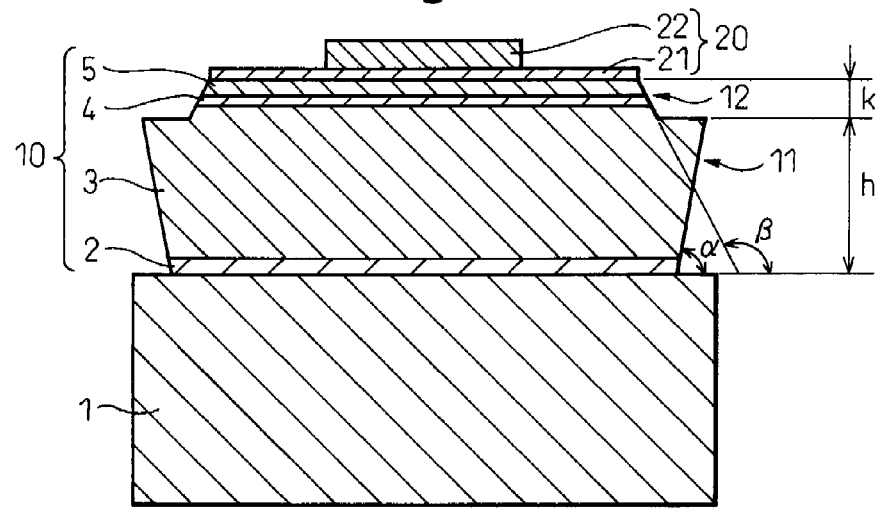
FIG. 1 is a cross-sectional view schematically showing an embodiment of a gallium nitride-based compound semiconductor light emitting device of the present invention.

FIG. 1 is a drawing schematically showing a cross-section of an embodiment of a gallium nitride-based compound semiconductor light emitting device of the present invention. In the drawing, reference symbol 1 indicates a substrate and reference symbol 10 indicates a gallium nitride-based compound semiconductor layer composed of a buffer layer 2, an n-type semiconductor layer 3, an emission layer 4 and a p-type semiconductor layer 5. Reference symbol 20 indicates a positive electrode composed of a transparent positive electrode 21 and a positive electrode bonding pad 22.

On at least one lateral surface of the gallium nitride-based compound semiconductor light emitting device of the present invention, an angle α formed by a bottom portion (substrate side) 11 of the gallium nitride-based compound semiconductor layer 10 and the substrate main surface is within the range of 5 to 85 degrees, while an angle β formed by a top portion 12 and the substrate main surface is within the range of 95 to 175 degrees.

When light emitted within the light emitting device is reflected at lateral surface 11, since the reflected light is equal to or less than the critical angle at the upper surface of the semiconductor layer, the light passes through and is efficiently extracted from the light emitting device, thereby improving light extraction efficiency. In consideration of the refractive index of the gallium nitride-based compound semiconductor and the light extraction side, the angle α is more preferably 20 to 80 degrees and particularly preferably 30 to 75 degrees.

In addition, if the lateral surface 12 of the top portion of the light emitting device is a forward taper, since light that is radiated onto lateral surface 12 is equal to or less than the critical angle, the light passes through and is also extracted from the lateral surface. Thus, this is thought to result in an improvement in light distribution uniformity. In consideration of the refractive index between the gallium nitride-based compound semiconductor and the light extraction side, angle β is more preferably 100 to 160 degrees and particularly preferably 105 to 150 degrees.

Device lateral surface 12 is positioned on the positive electrode side of the semiconductor layer, and is formed on the p-type semiconductor side. The height k of device lateral surface 12 is preferably about 0.1 to 3 μm, and in consideration of efficiently extracting light in the lateral direction from the emission layer, is more preferably about 0.2 to 1.5 μm. Since a certain degree of height must be secured for the height of reverse taper lateral surface 11, it preferably does not exceed 3 μm. In addition, if the height is less than 0.1 μm, there is only a slight improvement in light distribution uniformity. If the forward taper lateral surface 12 contains an emission layer, light in the lateral direction from the emission layer is extracted efficiently, thereby making this preferable.

Device lateral surface 11 is positioned on the substrate side of the semiconductor layer, and is mainly formed on the n-type semiconductor layer. The greater the height h of device lateral surface 11 the higher the light extraction efficiency. It is therefore preferable to reverse taper a portion other than the portion subjected to forward tapering (device lateral surface 12) to enable that portion to serve as device lateral surface 11, and the height h thereof, although varying according to the thickness of the semiconductor layer, is preferably about 0.1 to 10 μm.

The forward tapered lateral surface can be formed by, for example, a process like that described below. First, after patterning a semiconductor wafer with a resist so that portions that separate into each light emitting device (separation groove portions) are exposed, dry etching in the form of reactive ion etching (RIE) is carried out. At this stage, the semiconductor exposed portion is etched perpendicular to the substrate main surface, and separation grooves having a lateral surface perpendicular to the substrate main surface are formed. Next, after removing the resist, wet etching is carried out using an etching agent having orthophosphoric acid as a main component thereof. In this wet etching, only the A-plane, and not the C-plane, of the gallium nitride-based compound semiconductor is etched. Thus, only the lateral surface composed of the A-plane is etched while the bottom surface of the separation grooves, which is composed of the C-plane, is not etched. At this time, since the etching rate is faster at the corners of the semiconductor of the upper portions of the separation grooves, the etching rate increases from the bottom of the lateral surface towards the top of the lateral surface, and the separation groove lateral surface is formed to have a forward taper relative to the substrate main surface. Furthermore, Since the M-plane perpendicular to the A-plane is also resistant to wet etching, in the case of a rectangular light emitting device, a pair of mutually opposing lateral surfaces are forward tapered relative to the substrate main surface, while the other pair of lateral surfaces are perpendicular. Thus, in a light emitting device having different vertical and horizontal lengths, the long sides are preferably in the A-plane.

In addition, the aforementioned wet etching may be carried out after having mechanically formed separation grooves having a perpendicular lateral surface relative to the substrate main surface with a laser or dicer, or the corners of the semiconductor of the upper portion of the separation grooves may be mechanically ground to form a forward tapered lateral surface after having formed separation grooves having a perpendicular lateral surface.

On the other hand, the reverse tapered lateral surface can be formed by, for example, a process like that described below. After having formed a forward tapered portion as previously described, a negative electrode and/or positive electrode is formed as necessary followed by patterning with a resist so that the bottom surfaces of the separation grooves are exposed. Next, the semiconductor of the separation groove portions is removed with a laser scrubber and the like so that the depth of the separation grooves reaches the substrate. Subsequently, the exposed separation groove lateral surfaces are etched to a reverse tapered shape when wet etched using an etching agent having orthophosphoric acid for a main component thereof. The reason why the separation groove lateral surfaces are etched into a reverse tapered shape is believed to be as described below.

The dislocation density of a semiconductor layer stacked onto a dissimilar substrate is typically greater the closer to the substrate. The etching rate of wet etching increases the greater the dislocation density. Thus, the semiconductor that composes a separation groove lateral surface is etched by a larger amount the closer to the substrate resulting in the separation groove lateral surface having a reverse tapered shape. Furthermore, since dislocation density decreases in the upper portion of the semiconductor farther away from the substrate, the increase in etching rate due to the presence of corners is thought to exceed the decrease in etching rate attributable to the decrease in dislocation density, thereby resulting in a forward tapered lateral surface.

The resist used in these steps may be a positive resist or negative resist. Lithography is carried out in accordance with an ordinary procedure using a photomask having a suitable pattern so that the boundaries of individual devices are exposed. Alternatively, lithography is not necessarily required if the resist covers the semiconductor wafer and the boundaries of individual devices can be distinguished. The film thickness is preferably 0.1 to 20 μm. If the film is excessively thin, the film peels easily during wet etching and the like, while if the film is excessively thick, there are problems of the resolution of lithography and of making it difficult to recognize the pattern below. The film thickness is preferably 0.5 to 10 μm and more preferably 1 to 5 μm.

Removal of the gallium nitride-based compound semiconductor down to the substrate is preferably carried out with a laser. By selecting a laser having a wavelength that is shorter than the absorption edge of the gallium nitride-based compound semiconductor, the processed location is limited to the location irradiated by the laser due to the high absorption coefficient reaching $10^5$ cm$^{-1}$ of the gallium nitride-based compound semiconductor. Processing can also be carried out at a narrow width of less than 10 μm by suitably selecting the laser optics, thereby making it possible to improve device yield. Although the laser processing depth of the substrate is arbitrarily selected within the range of 1 μm or more, if the processing depth is excessively shallow, there is susceptibility to the occurrence of shape defects during subsequent separation treatment. Although the occurrence of defects is suppressed if the processing depth is 10 μm or more, the processing depth is more preferably 20 μm or more.

Alternatively, a mechanical method using a dicer can also be used. In this case, device chipping and cracking can be suppressed by selecting a suitable blade used for cutting to reduce as much as possible the amount the dicer cuts into the substrate. Although the amount the dicer cuts into the substrate is suitably selected to be within the range of 1 to 50 μm, it is preferably 1 to 20 μm and more preferably 1 to 10 μm.

Wet etching is carried out using orthophosphoric acid. Orthophosphoric acid is added to a beaker contained in a prescribed heating apparatus followed by heating to 100 to 400° C. If the heating temperature is excessively low, the etching rate slows, while if the heating temperature is excessively high, peeling of the mask occurs. The heating temperature is preferably 150 to 300° C. and more preferably 180 to 240° C., thereby allowing the obtaining of both an adequate etching rate and mask resistance.

Figure 2:
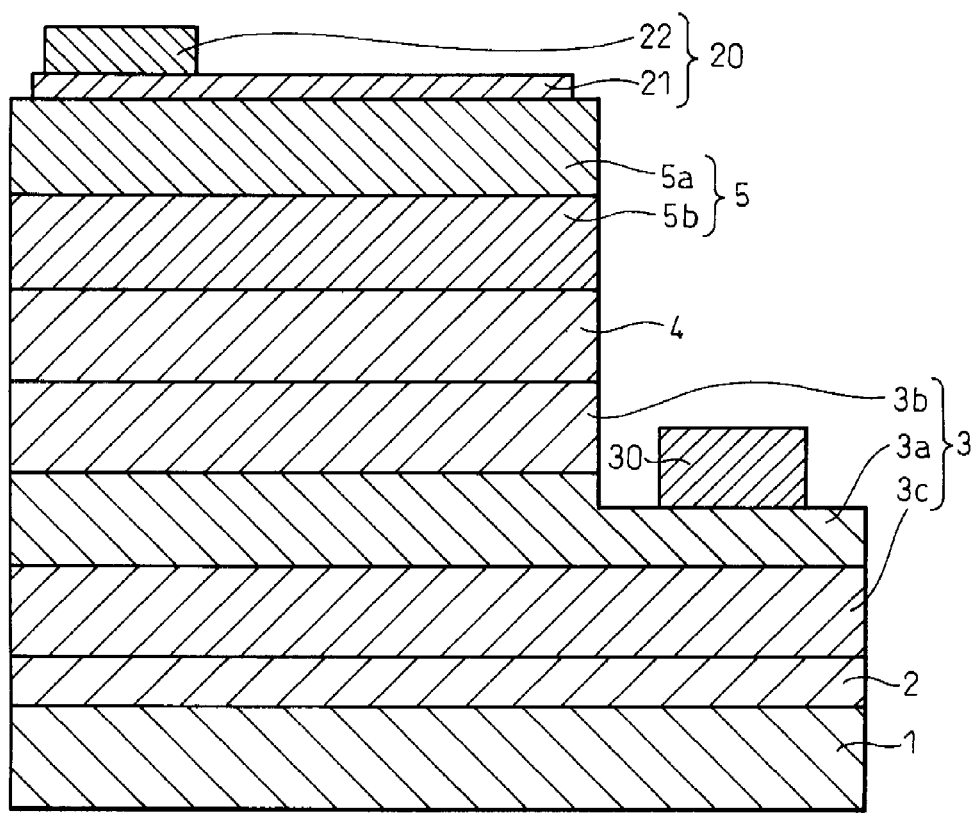
FIG. 2 is a drawing schematically showing a typical layer structure of a gallium nitride-based compound semiconductor light emitting device.

As the layer structure of a gallium nitride-based compound semiconductor light emitting device, there is, for example, a known layer structure like that shown in FIG. 2, and the gallium nitride-based compound semiconductor light emitting device of the present invention can also have any type of layer structure, including a known layer structure as shown in the drawing. In FIG. 2, reference symbol 1 indicates a substrate, reference symbol 2 indicates a buffer layer, and reference symbol 3 indicates an n-type semiconductor layer. The n-type semiconductor layer is composed of an underlying layer (3*c*), an n-type contact layer (3*a*) and an n-type clad layer (3*b*). Reference symbol 4 indicates an emission layer, and reference symbol 5 indicates a p-type semiconductor layer. The p-type semiconductor layer is composed of a p-type clad layer (5*b*), and a p-type contact layer (5*a*). Reference symbol 20 indicates a positive electrode, and it is composed of a transparent positive electrode (21) and a positive electrode bonding pad (22). Reference symbol 30 indicates a negative electrode.

In the present invention, a known substrate material can be used without limitation for substrate 1 that is selected from the group consisting of oxide single crystal substrates such as sapphire single crystals (Al$_2$O$_3$: A-plane, C-plane, M-plane, R-plane), spinel single crystals (MgAl$_2$O$_4$), ZnO single crystals, LiAlO$_2$ single crystals, LiGaO$_2$ single crystals, MgO single crystals or Ga$_2$O$_3$ single crystals, and non-oxide single crystal substrates such as Si single crystals, SiC single crystals, GaAs single crystals, AlN single crystals, GaN single crystals or ZrB$_2$ and other boride single crystals. Among these, sapphire single crystals or SiC single crystals are preferable. In addition, the substrate may be an on-axis substrate or off-axis substrate.

In the case of using sapphire single crystals for a substrate, gallium nitride-based compound semiconductor single crystals grown on the substrate are known to grow at an orientation in conformity with the sapphire single crystals (Al$_2$O$_3$: A-plane, C-plane, M-plane, R-plane).

In the case of etching a plane perpendicular to the C-plane of gallium nitride-based compound semiconductor single crystals grown using the C-plane of sapphire single crystals as a substrate from the direction of the C axis, the crystal apices of a plane other than the M-plane, such as the A-plane, are exposed and easily etched, while the M-plane is resistant to etching. Thus, in the present invention, at least one of the lateral surfaces of the light emitting device is preferably made to be a plane other than the M-plane, such as the A-plane. In addition, in the case the planar shape of the light emitting device is rectangular, the long sides are preferably made to be a plane other than the M-plane, such as the A-plane.

Semiconductors of various compositions represented by the general formula $Al_xIn_yGa_{1-x-y}N$ ($0 \leq x \leq 1$, $0 \leq y < 1$, $0 \leq x+y \leq 1$) are known as gallium nitride-based compound semiconductors constituting a buffer layer, n-type semiconductor layer, emission layer and p-type semiconductor layer. In the group III nitride compound semiconductor constituting a buffer layer, n-type semiconductor layer and p-type semiconductor layer in the present invention as well, semiconductors having various compositions represented by the general formula $Al_xIn_yGa_{1-x-y}N$ ($0 \leq x \leq 1$, $0 \leq y < 1$, $0 \leq x+y \leq 1$) can be used without limitation.

Examples of methods for growing these group III nitride semiconductors include metal organic chemical vapor deposition (MOCVD), molecular beam epitaxy (MBE) and hydride vapor phase epitaxy (HVPE). Although MOCVD is preferable since it facilitates control of composition and is suited for volume production, the method used is not necessarily limited to this method.

In the case of employing MOCVD for growing the aforementioned semiconductor layer, a metal organic material in the form of trimethyl gallium (TMG) or triethyl gallium (TEG) is mainly used for the raw material of the group III element gallium, or trimethyl aluminum (TMA) or triethyl aluminum (TEA) is mainly used for the raw material of a similar group III element Al. In addition, trimethyl indium (TMI) or triethyl indium (TEI) is used as the raw material for the In serving as a composite material of the emission layer. Ammonia ($NH_3$) or hydrazine ($N_2H_4$) and the like is used for the group V N source.

Si or Ge is used for the dopant raw material in the n-type semiconductor layer. Monosilane ($SiH_4$) or disilane ($Si_2H_4$) is used for the Si raw material, while germane ($GeH_4$) or an organic germanium compound is used for the Ge raw material. Mg is used for the dopant raw material in the p-type semiconductor layer. Examples of raw materials that can be used include biscyclopentadienyl magnesium ($Cp_2Mg$) and bisethylcyclopentadienyl magnesium ($(EtCp)_2Mg$).

The low-temperature buffer method disclosed in Japanese Patent No. 3026087 or Japanese Unexamined Patent Publication No. 4-297023, or a lattice mismatch crystal epitaxial growth technique referred to as a seeding process (SP) disclosed in, for example, Japanese Unexamined Patent Publication No. 2003-243302, can be used to stacke a gallium nitride-based compound semiconductor on a substrate as described above.

In the case of using a low-temperature buffer method or lattice mismatch crystal epitaxial growth technique such as SP, the gallium nitride-based compound semiconductor serving as the underlying layer stacked on the buffer layer is preferably undoped or low-doped (about $5 \times 10^{17}$ cm$^{-3}$) GaN. The film thickness of the underlying layer is preferably 1 to 20 µm and more preferably 5 to 15 µm.

An n-type contact layer composed of n-type GaN is grown on the underlying layer to contact the negative electrode and supply current. The n-type contact layer is grown by supplying an n-type dopant to n-type GaN at $1 \times 10^{18}$ cm$^{-3}$ to $1 \times 10^{19}$ cm$^{-3}$. Si or Ge is typically selected for the n-type dopant. Doping may be carried out uniformly or a structure may be adopted in which a low-doped layer and high-doped layer are cyclically repeated. The latter intermittent doping in particular is effective for inhibiting pitting that occurs during crystal growth.

An n-type clad layer is preferably provided between the n-type contact layer and the emission layer. The n-type clad layer can be formed with AlGaN, GaN or InGaN and the like, and in the case of forming with InGaN, it goes without saying that the use of InGaN having a band gap that is larger than the band gap of InGaN constituting the active layer is preferable. The carrier concentration of the n-type clad layer may be equal to, greater than or less than that of the n-type contact layer.

The emission layer on the n-type clad layer preferably has a quantum well structure. This may be a single quantum well structure having only a single well layer, or a multiple quantum well structure having a plurality of well layers. In particular, a multiple quantum well structure is preferable since it is also able to provide high output and low driving voltage when used as the structure of a device using a gallium nitride-based compound semiconductor. Furthermore, in the case of a multiple quantum well structure, the entire combination of the well layer (active layer) and the barrier layer is referred to as the emission layer in the present description.

The p-type semiconductor layer normally has a thickness of 0.01 to 1 µm, and is composed of p-type clad layer that contacts the emission layer and a p-type contact layer for forming a positive electrode thereon. The p-type contact layer may be also used as the p-type clad layer. The p-type layers are formed using, for example, GaN or AlGaN, while Mg is doped as the p-type dopant.

Negative electrodes having various known compositions and structures can be used without limitation for the negative electrode. Examples of contact materials for the negative electrode that contact the n-type contact layer include Al, Ti, Ni and Au as well as Cr, W and V. It goes without saying that the entire negative electrode can be used in the form of a multilayer structure for imparting bondability and the like. In particular, covering the uppermost layer with Au is preferable since this facilitates bonding.

Positive electrodes having various known compositions and structures can also be used without limitation for the positive electrode. A metal such as Au, Ni, Co, Cu, Pd, Pt, Rh, Os, Ir or Ru can be used for the material of the positive electrode. In addition, a transparent, conductive metal oxide such as ITO, NiO or CoO can also be used. The form in which a transparent, conductive metal oxide is used may be in the form of a mass contained within a film of the aforementioned metals, or a layer formed overlapping a film of the aforementioned metals. Naturally, a transparent, conductive metal oxide can also be used alone. ITO is particularly preferable because of its superior transparency and high conductivity.

Although varying according to the material used, the thickness of the positive electrode is preferably 10 to 1000 nm in most cases. In the case of ITO, for example, a thickness of 100 to 800 nm is preferable, while a thickness of 200 to 500 nm is more preferable, for allowing satisfactory transmission at the emission wavelength.

Formation of the positive electrode film can be carried out with a commonly used technique well known in the technical field, such as vacuum deposition or sputtering. In addition, a photolithography technique or lift-off technique well known in the technical field can be used to carry out formation in a shape provided with an opening. After having formed the positive electrode, thermal annealing may be carried out for the purpose of alloy formation and increasing transparency.

A bonding pad is normally provided on the positive electrode that is connected to a wire for supplying current. Various known structures using materials such as Au, Al, Ni, Ti or Cu can be used without limitation for the bonding pad. In addition, the thickness is preferably 100 to 1500 nm. Since a thicker bonding pad results in higher bondability due to the characteristics of bonding pads, the thickness is preferably 300 nm or more. Moreover, the thickness is preferably 1000 nm or less from the viewpoint of production cost.

The form of the light emitting device may be a so-called face-up (FU) type in which emitted light is extracted from the semiconductor side using a transparent positive electrode, or it may be of the so-called flip-chip (FC) type in which emitted light is extracted from the substrate side using a reflecting positive electrode.

The gallium nitride-based compound semiconductor light emitting device of the present invention can be used as, for example, a lamp by providing with a transparent cover using a known technique in the art. In addition, a white lamp can be fabricated by combining the gallium nitride-based compound semiconductor light emitting device of the present invention with a cover having a phosphor.

In addition, since a lamp fabricated from the gallium nitride-based compound semiconductor light emitting device of the present invention has a high emission output and superior light distribution uniformity, electronic devices such as cell phones, displayed and panels incorporating lamps fabricated with this technology, and mechanical apparatuses such as automobiles, computers and game machines incorporating those electronic devices, are able to realize high performance. High performance is demonstrated in particular in battery-powered devices such as cell phones, game machines, toys and automobile parts.

EXAMPLES

Although the following provides a detailed explanation of the present invention through examples and comparative examples thereof, the present invention is not limited to only these examples.

Example

Figure 3:
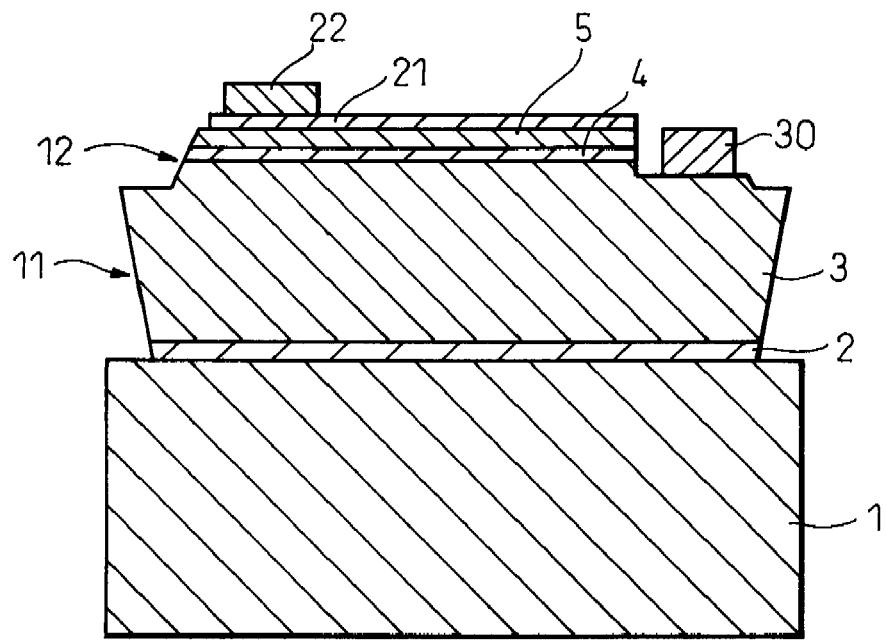
FIG. 3 is a schematic drawing showing a cross-section of a gallium nitride-based compound semiconductor light emitting device fabricated in an example of the present invention.

A cross-sectional schematic drawing of a gallium nitride-based compound semiconductor light emitting device fabricated in the present example is shown in FIG. 3. The stacked structure of the gallium nitride-based compound semiconductor is composed by sequentially stacking an n-type semiconductor layer 3, comprising an underlying layer composed of an undoped GaN layer (layer thickness=8 μm), an n-type contact layer composed of an Si-doped n-type GaN layer (layer thickness=2 μm, carrier concentration=$1 \times 10^{19}$ cm$^{-3}$), and an n-type clad layer composed of an Si-doped $Al_{0.07}Ga_{0.93}N$ layer (layer thickness=25 nm, carrier concentration=$1 \times 10^{18}$ cm$^{-3}$), an emission layer 4, having a multiple quantum well structure in which six layers of an Si-doped GaN barrier layer (layer thickness=14.0 nm, carrier concentration=$1 \times 10^{18}$ cm$^{-3}$) and five layers of an undoped $In_{0.20}Ga_{0.80}N$ well layer (layer thickness=2.5 nm) are alternately stacked, and a p-type semiconductor layer 5, comprising a p-type clad layer composed of an Mg-doped p-type $Al_{0.07}Ga_{0.93}N$ layer (layer thickness=10 nm) and a p-type contact layer composed of an Mg-doped $Al_{0.02}Ga_{0.98}N$ layer (layer thickness=150 nm), on a substrate 1 composed of single crystal sapphire C-plane ((0001) crystal plane) with a buffer layer 2 composed of AlN juxtaposed there between. Each composite layer of the stacked structure was grown by an ordinary reduced-pressure MOCVD technique.

In particular, the p-type contact layer composed of Mg-doped AlGaN was grown according to the procedure described below.

(1) After having finished growing the p-type clad layer composed of an Mg-doped $Al_{0.07}Ga_{0.93}N$ layer, the pressure in a growth reaction oven was set to $2 \times 10^4$ pascals (Pa). Hydrogen was used for the carrier gas.

(2) Vapor phase epitaxy of the Mg-doped AlGaN layer was started at 1020° C. using trimethyl gallium, trimethyl aluminum and ammonia for the raw materials, and using biscyclopentadienyl magnesium for the Mg doping source.

(3) The Mg-doped $Al_{0.02}Ga_{0.98}N$ layer having a layer thickness of 150 nm was grown by continuously supplying trimethyl gallium, trimethyl aluminum, ammonia and biscyclopentadienyl magnesium to the growth reaction oven over the course of 4 minutes.

(4) The growth of the Mg-doped $Al_{0.02}Ga_{0.98}N$ layer was discontinued by interrupting the supply of trimethyl gallium, trimethyl aluminum and biscyclopentadienyl magnesium to the growth reaction oven.

Following completion of vapor phase epitaxy of the contact layer composed of an Mg-doped AlGaN layer, the carrier gas was immediately switched from hydrogen to nitrogen, the flow rate of ammonia was reduced and the flow rate of the nitrogen carrier gas was increased corresponding to the amount of the decrease. More specifically, ammonia, which accounted for 50% of the total amount of flowing gas by volume during epitaxy, was reduced to 0.2%. At the same time, the supply of current to a high-frequency induction heater used to heat the substrate was discontinued.

Moreover, after maintaining in this state for 2 minutes, the flow of ammonia was discontinued. The temperature of the substrate at that time was 850° C.

After cooling to room temperature while in this state, the stacked structure was taken out of the growth reaction oven followed by quantification of the magnesium and hydrogen atom concentrations in the p-type contact layer composed of the Mg-doped AlGaN layer by ordinary SIMS analysis. Mg atoms were distributed at a roughly constant concentration of $7 \times 10^{19}$ cm$^{-3}$ from the surface in the direction of depth. On the other hand, hydrogen atoms were present at a roughly constant concentration of $6 \times 10^{19}$ cm$^{-3}$. In addition, resistivity as measured by ordinary TLM was estimated to be about 150 Ωcm.

An LED was fabricated using the stacked structure described above.

First, patterning was carried out with a resist so that the separation groove portions separating each device were exposed using a known lithography technique to form forward tapered surface 12. Subsequently, RIE etching was carried out on the exposed separation groove portions not coated with resist to form separation grooves about 1.2 μm deep having perpendicular lateral surfaces. Subsequently, the resist was removed by washing off with a solvent.

Next, the perpendicular lateral surfaces of the separation grooves were treated with an etching agent having orthophosphoric acid as a main component thereof to form forward-tapered lateral surfaces. As a result of this treatment, the A-plane ((11-20) crystal plane) was etched while the C-plane ((0001) crystal plane) was not etched, and the angle β of the separation groove lateral surface was generally 110 degrees relative to the substrate main surface. The lateral surfaces of separation grooves having the perpendicular M-plane as a lateral surface thereof remained perpendicular.

Next, patterning was carried out so as to form a transparent positive electrode 21 composed of ITO only on the p-type AlGaN contact layer using a known photolithography or lift-off technique, and an ITO electrode having a thickness of 250 nm was formed by a known sputtering method.

Next, in order to expose the n-type contact layer, a pattern was produced that left uncovered only the region where the n-type contact layer is exposed (region where negative electrode 30 is formed), and the n-contact layer was exposed by ordinary RIE etching with a dry etching apparatus. The covering resist was subsequently removed with solvent, and measurement of the depth from the surface of the p-type semiconductor layer to the exposed n-type contact layer yielded a value of about 0.7 μm.

Next, according to the procedure described below, negative electrode 30 was formed at the region where the negative electrode is formed, on the exposed n-type contact layer.

After having uniformly coated a resist over the entire surface, the resist was removed from the portion where the negative electrode is formed, on the exposed n-type contact layer, using a known lithography technique. And then negative electrode 30 composed of 100 nm of Ti and 200 nm of Au in that order from the semiconductor side was formed using an ordinarily used vacuum deposition method. The resist was subsequently removed together with the Ti and Au formed thereon by a known method.

Next, in order to form positive electrode bonding pad 22 on transparent positive electrode 21 composed of ITO, patterning was carried out in the same manner as in the case of the negative electrode, Cr was formed as an adhesive layer at a thickness of 40 nm, and then Ti was formed at a thickness of 100 nm and Au was subsequently formed as the uppermost layer at a thickness of 1000 nm to obtain the positive electrode bonding pad 22.

Figure 4:
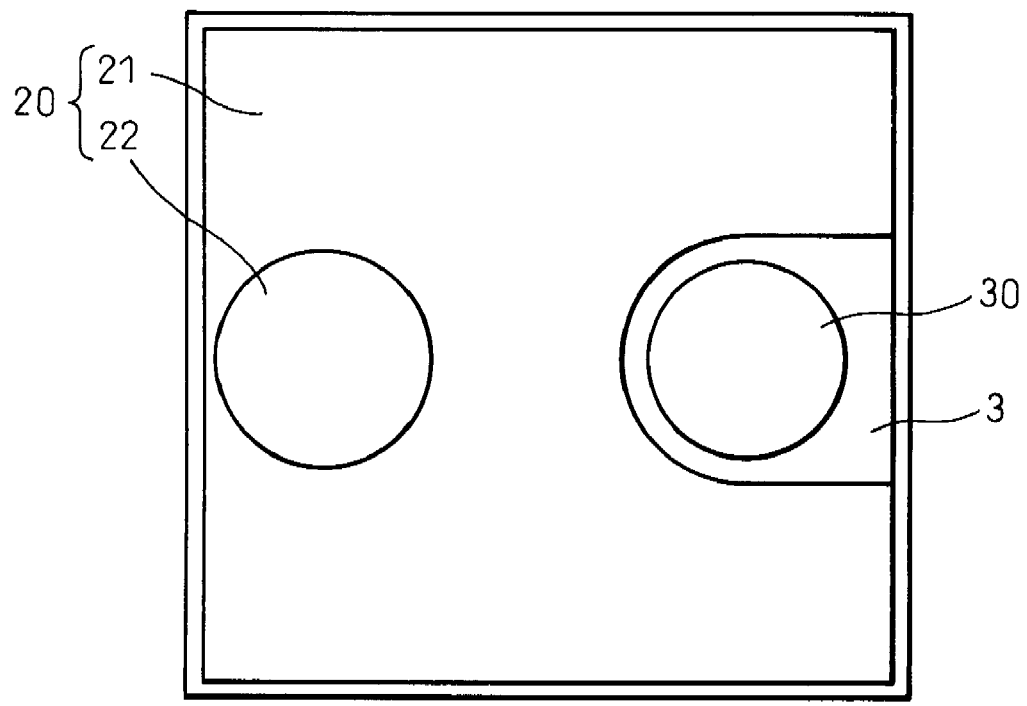
FIG. 4 is a schematic drawing showing an overhead view of a gallium nitride-based compound semiconductor light emitting device fabricated in an example of the present invention.

FIG. 4 is an overhead schematic drawing of a light emitting device produced in the present example that shows the positional relationship of the electrodes fabricated in the process described above.

The following provides an explanation of the procedure for fabricating reverse tapered surface 11. A photoresist is coated using lithography onto a wafer on which the electrode fabrication process has been completed. Subsequently, only the boundary (separation groove portions) of each device is again exposed by lithography.

Next, although the substrate was then exposed by removing the semiconductor at the boundaries (separation groove portions) of the devices, a laser was used as a means for removing the gallium nitride-based compound semiconductor layer down to the substrate. Separation grooves were fabricated down to a depth of 20 μm in the substrate using a laser wavelength of 266 nm, frequency of 50 kHz, output of 1.6 W and processing speed of 70 mm/sec. The stage was then rotated by 90 degrees, and separation grooves were similarly formed in the direction of the Y axis.

Following fabrication of the separation grooves, the wafer was immersed for 20 minutes in a quartz beaker containing orthophosphoric acid heated to 180° C. using a heating apparatus to carry out wet etching. The etched amount of the gallium nitride-based compound semiconductor layer was 5.2 μm. Following completion of wet etching, the wafer was rinsed with water using ultrasonic waves, and the etching mask composed of the resist was further removed by organic washing. As a result of this treatment, etching was not carried out in the direction of the C-plane ((0001) crystal plane), but only carried out in the direction of the A-plane ((11-20) crystal plane), and the angle α of the separation groove lateral surface was generally 70 degrees relative to the substrate main surface. The lateral surfaces of separation grooves having the perpendicular M-plane as a lateral surface thereof remained perpendicular.

Following etching treatment, the wafer was polished on the substrate back side to reduce the thickness of the substrate to 80 μm followed by separation of each of the light emitting devices with a breaking apparatus.

Figure 5:
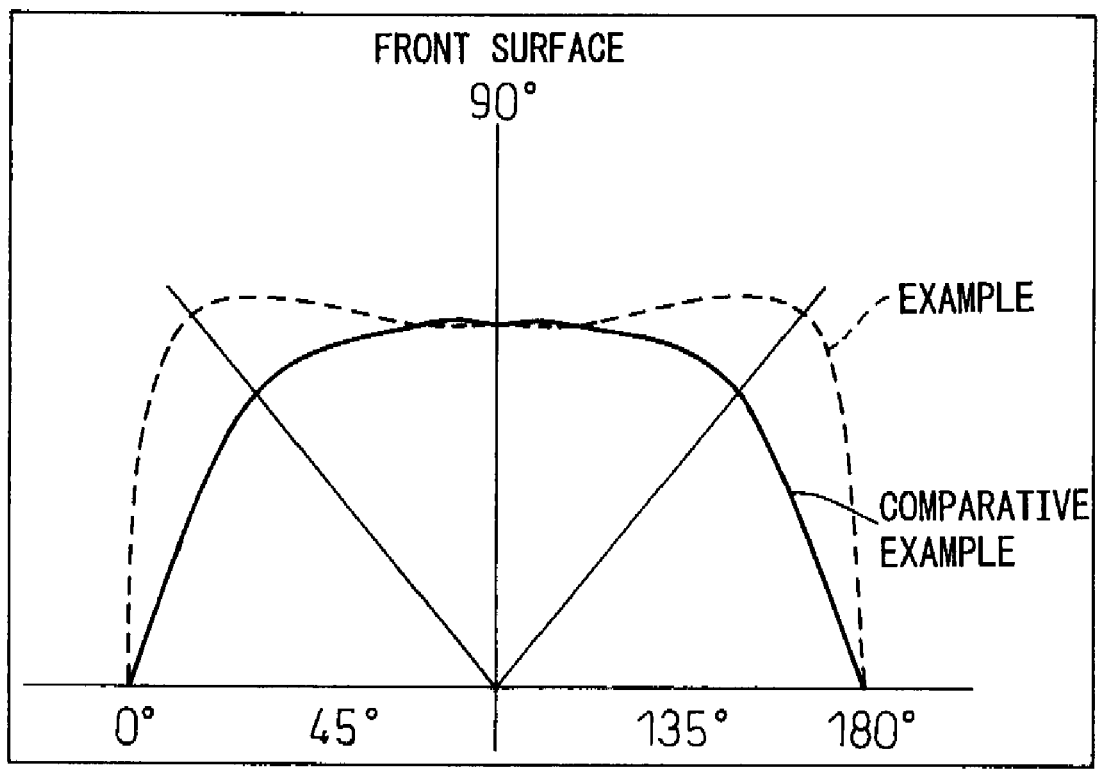
FIG. 5 is a drawing showing the results of evaluating the light distribution of gallium nitride-based compound semiconductor light emitting devices fabricated in an example of the present invention and a comparative example.

Evaluation of the output of the separated light emitting devices with an integrating sphere yielded a value of 12 mW at a current of 20 mA. In addition, measurement of driving voltage yielded a voltage of 3.35 V in the case of applying a current of 20 mA. The results of evaluating the light distribution of this device are shown in FIG. 5 along with the results for a comparative example. In FIG. 5, the angle from the front of the light emitting device (front surface: 90 degrees) is plotted on the horizontal axis, while optical intensity at that angle is plotted on the vertical axis. As is clear from FIG. 5, the light emitting device of the present example has improved extraction of light in the direction of the lateral surface as compared with the light emitting device of the comparative example, and has superior light distribution uniformity. In addition, measurement of output after mounting in a special light emitting package having a reduced interval between the package lateral surface and the light emitting device yielded a value of 18.9 mW at a current of 20 mA.

Comparative Example

A light emitting device was fabricated using the same procedure as the example with the exception of not forming forward taper 12. When the resulting light emitting device was evaluated in the same manner as the example, the output was found to be 12 mW and the driving voltage was found to be 3.35 V. In addition, as indicated by the light distribution characteristics shown in FIG. 5, extraction characteristics in the diagonal direction were inferior in comparison with the example in which a forward taper had been formed. Moreover, when this light emitting device was mounted in a special light emitting package that same as that used in the example, measurement of output yielded a value of 16.8 mW at a current of 20 mA. Thus, efficiency in the package mounting stage was determined to be inferior as compared with the case of forming a forward taper.

INDUSTRIAL APPLICABILITY

The gallium nitride-based compound semiconductor light emitting device of the present invention has a high emission output and superior light distribution uniformity, and has extremely high value for industrial use.

The invention claimed is:

1. A gallium nitride-based compound semiconductor light emitting device comprising a substrate and a gallium nitride-based compound semiconductor layer stacked on the substrate, wherein the substrate is a C-plane sapphire substrate and, on at least one lateral surface of the light emitting device, the bottom (substrate side) of the semiconductor layer is a reverse taper inclined 5 to 85 degrees relative to the substrate main surface and the top of the semiconductor layer is a forward taper inclined 95 to 175 degrees relative to the substrate main surface.

2. The gallium nitride-based compound semiconductor light emitting device according to claim 1, wherein the thickness of the forward tapered portion is 0.1 to 3 μm.

3. The gallium nitride-based compound semiconductor light emitting device according to claim 1, wherein the thickness of the reverse taper portion is 0.1 to 10 μm.

4. The gallium nitride-based compound semiconductor light emitting device according to claim 1, wherein the forward taper and the reverse taper are respectively formed by chemical etching having orthophosphoric acid as a main component thereof.

5. The gallium nitride-based compound semiconductor light emitting device according to claim 1, wherein a first lateral surface having the forward taper and the reverse taper is an A-plane side as viewed from the direction of the C-plane on the sapphire substrate.

6. The gallium nitride-based compound semiconductor light emitting device according to claim 1, wherein a second lateral surface that is an M-plane side when viewed from the direction of the C-plane on the sapphire substrate is a surface perpendicular to the C-plane and is not formed by the forward taper and the reverse taper.

7. The gallium nitride-based compound semiconductor light emitting device according to claim 1, wherein an external shape of the light emitting device is a quadrangle, each of opposing first lateral surfaces has a forward taper and a reverse taper, and each of opposing second lateral surfaces is a perpendicular surface.

8. A lamp comprising the gallium nitride-based compound semiconductor light emitting device according to claim 1.

9. An electronic device incorporated with the lamp according to claim 8.

10. A mechanical apparatus incorporated with the electronic device according to claim 9.

* * * * *